United States Patent
Hu et al.

(10) Patent No.: US 8,957,694 B2
(45) Date of Patent: Feb. 17, 2015

(54) WAFER LEVEL PACKAGE RESISTANCE MONITOR SCHEME

(75) Inventors: Kunzhong Hu, Irvine, CA (US); Chonghua Zhong, Irvine, CA (US); Edward Law, Ladera Rance, CA (US)

(73) Assignee: Broadcom Corporation, Irvine, CA (US)

( * ) Notice: Subject to any disclaimer, the term of this patent is extended or adjusted under 35 U.S.C. 154(b) by 288 days.

(21) Appl. No.: 13/477,313

(22) Filed: May 22, 2012

(65) Prior Publication Data

US 2013/0314120 A1    Nov. 28, 2013

(51) Int. Cl.
*G01R 31/26* (2014.01)

(52) U.S. Cl.
USPC ........ 324/762.03; 324/705; 324/699; 257/43; 257/48

(58) Field of Classification Search
USPC .................................................. 324/762.03
See application file for complete search history.

(56) References Cited

U.S. PATENT DOCUMENTS

| | | | |
|---|---|---|---|
| 6,384,664 B1 * | 5/2002 | Hellums et al. | 327/525 |
| 8,502,217 B2 * | 8/2013 | Sato et al. | 257/43 |
| 8,616,065 B2 * | 12/2013 | Stewart et al. | 73/721 |
| 2005/0017746 A1 * | 1/2005 | Matsumoto et al. | 324/763 |
| 2005/0116733 A1 * | 6/2005 | Barr et al. | 324/763 |
| 2008/0303542 A1 * | 12/2008 | Wang | 324/763 |
| 2009/0009196 A1 * | 1/2009 | De Vries et al. | 324/699 |
| 2009/0015285 A1 * | 1/2009 | Farooq et al. | 324/763 |
| 2010/0187527 A1 * | 7/2010 | Van Geloven et al. | 257/48 |
| 2010/0253372 A1 * | 10/2010 | Rousseville et al. | 324/705 |
| 2010/0283049 A1 * | 11/2010 | Sato et al. | 257/43 |
| 2011/0140730 A1 * | 6/2011 | Zieren et al. | 324/762.03 |
| 2011/0228010 A1 * | 9/2011 | Silverbrook et al. | 347/67 |
| 2011/0309892 A1 * | 12/2011 | Frye et al. | 333/25 |
| 2012/0025863 A1 * | 2/2012 | Ochs et al. | 324/762.03 |
| 2012/0068174 A1 * | 3/2012 | Kumar et al. | 257/48 |
| 2012/0125114 A1 * | 5/2012 | Stewart et al. | 73/721 |
| 2012/0280708 A1 * | 11/2012 | Ku et al. | 324/762.03 |
| 2013/0049793 A1 * | 2/2013 | Chen et al. | 324/762.03 |

FOREIGN PATENT DOCUMENTS

| | | |
|---|---|---|
| TW | 591239 | 6/2004 |
| TW | 200848751 A | 12/2008 |

* cited by examiner

*Primary Examiner* — Benjamin M Baldridge
(74) *Attorney, Agent, or Firm* — Brinks Gilson & Lione

(57) ABSTRACT

An integrated circuit includes a monitoring circuit and a monitored circuit connected with the monitoring circuit. The monitoring circuit is operable to determine during fabrication if a resistance of a connection between an in-fab redistribution layer connector and a post-fab redistribution layer connector exceeds a threshold.

18 Claims, 4 Drawing Sheets

WAFER LEVEL PACKAGE RESISTANCE MONITOR SCHEME

TECHNICAL FIELD

This disclosure relates to resistance monitoring control and methodologies for integrated circuit devices and to contact resistance of circuitry stack-up and connections within wafer level package construction.

BACKGROUND

Wafer-level packaging (WLP) is the technology of packaging an integrated circuit at wafer level. The WLP can be mounted directly to a printed circuit board. Wafer-level packaging has the ability to enable integration of wafer fab, packaging, test, and burn-in at wafer level to streamline the manufacturing process undergone by a device from silicon start to customer shipment. WLP can extend the wafer fab processes to include device interconnection and device protection processes. Wafer-level packaging can involve attaching the top and bottom outer layers of packaging, and the solder bumps, to the integrated circuit while still in the wafer, and then dicing the wafer.

BRIEF DESCRIPTION OF THE DRAWINGS

The innovation may be better understood with reference to the following drawings and description of the numerical references throughout the different views

DETAILED DESCRIPTION

The discussion below makes reference to in-line resistance monitoring schemes for integrated circuits. Sometimes it can be difficult to identify contact resistance issues when fabricating integrated circuits. For example, after the foundry processes the wafer there may be a layer of Aluminum oxide on top of an aluminum pad. This Aluminum oxide layer thickness can be difficult to monitor at the integrated circuit assembly house. If the layer is thicker than a determined thickness it can add unwanted resistance between the in-fab and post-fab redistribution layers (RDL's). If the resistance is high this may cause functional failure of the integrated circuit. Currently there may be no way to check the resistance during the integrated circuit assembly process. Therefore, resistance issues may only be checked later in the process at final wafer probe. If resistance issues are discovered later in the manufacturing process this can cause high yield loss and wafer scrap.

Figure 1:
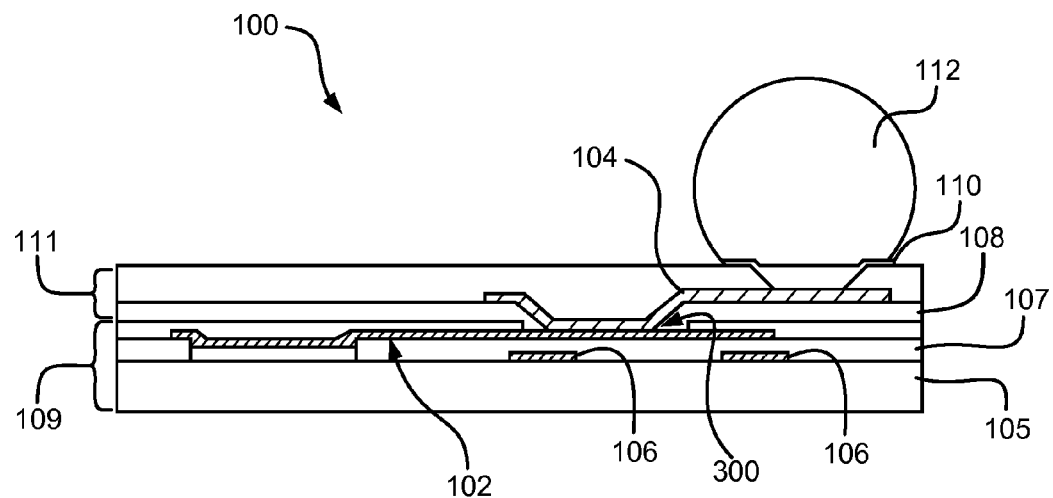
FIG. 1 is a block diagram of an exemplary integrated circuit package structure in cross-section.

FIG. 1 is a block diagram of an exemplary integrated circuit package structure 100 in cross-section. For exemplary purposes, the integrated circuit is described as a wafer level ball grid array (BGA) package structure. The discussion may also be relevant for other types of integrated circuit package structures such as fan-out WLP packaging, double-sided RDL, multi-layer RDL and through-silicon vias (TSV) based interposers and chip stack packages. The package structure 100 can be included in an in-fab RDL connector 102 interconnect and post-fab RDL connector 104. The in-fab RDL 102 and the post-fab RDL 104 can operate to electrically connect the in-fab portion of the integrated circuit to the post-fab portion.

The in-fab RDL connector 102 can be formed on top of microchip passivation layer 107 and metal pads 106 of silicon layer stack-up 105. The in-fab RDL connector 102 can be made of aluminum or other electrically conducting material and can be formed as part of an aluminum pad (AP) layer. The silicon layer stack-up 105, the passivation layer 107 and the in-fab RDL connector 102 can form an in-fab structure 109. More or less layers can be used in the in-fab structure 109.

The package structure 100 can also include a post-fab passivation layer 108, e.g., polybenzoxazole (PBO), and a under bump metallization (UBM) layer 110. The UBM can holder solder ball 112. The post-fab RDL 104 can be formed from copper or other metal. The post-fab passivation layer 108, the UBM 110 and the post-fab RDL 104 can form a post-fab structure 111. More or less layers can be used in the post-fab structure 111.

Figure 2:
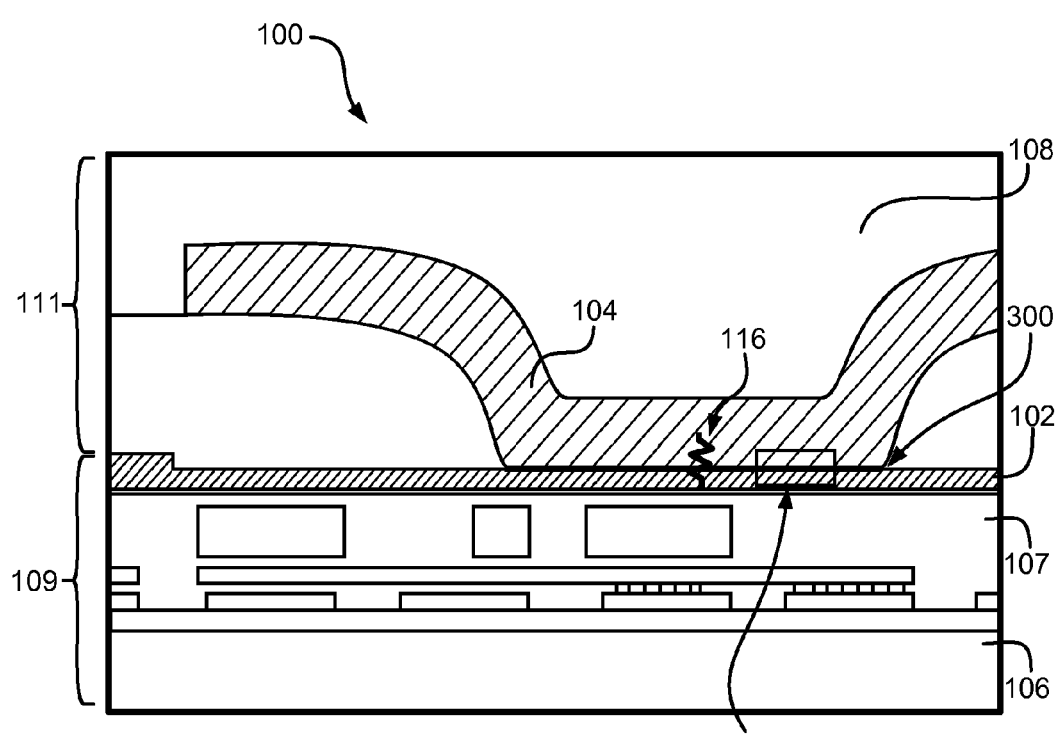
FIG. 2 is a block diagram of an exploded view of the exemplary integrated circuit package structure of FIG. 1.

FIG. 2 is a block diagram of the exemplary integrated circuit package structure 100 of FIG. 1 in exploded view. The in-fab structure 109 can be processed at the foundry. The post-fab structure 111 can be processed, for example at an assembly house or a foundry. An aluminum oxide layer 300 (shown best in FIG. 3) can form on the in-fab RDL connector 102 and create a contact resistance 116. An exemplary contact resistance 116 is illustrated by the resister icon between the connection of the post-fab RDL connector 104 and the in-fab RDL connector 102. To better illustrate the aluminum oxide layer 300, section 200 of FIG. 2 is shown in exploded view in FIG. 3.

Figure 3:
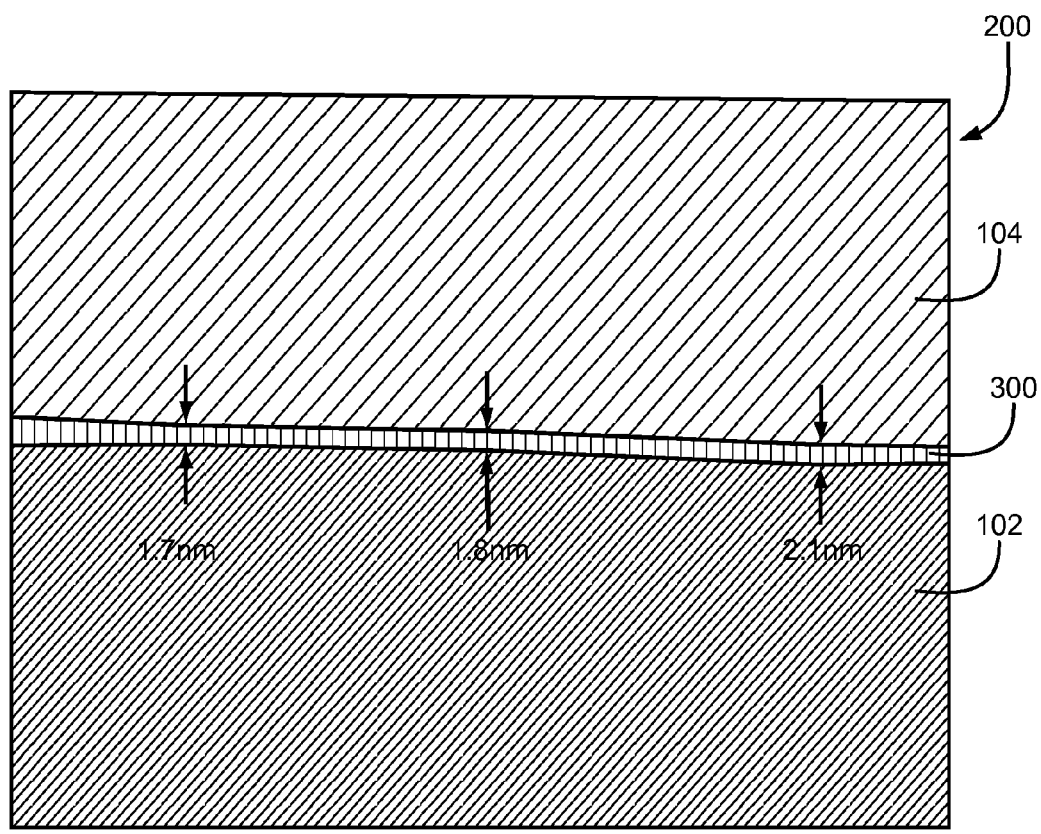
FIG. 3 is a block diagram of an exploded view of a contact area between the post-fab RDL and the in-fab RDL of the exemplary integrated circuit package of FIG. 1.

FIG. 3 is a block diagram of an exploded view of a contact area between the post-fab RDL connector 104 and the in-fab RDL connector 102 of the exemplary integrated circuit package 100 of FIG. 1. When the foundry completes processing the in-fab structure 109 and sends it to the assembly house for post-fab processing an oxide layer 300 can form on the in-fab RDL connector 102 as a material of the RDL connector 102 is exposed to air. A thickness of the oxide layer 300 may not be controllable or easy to monitor and can therefore vary. The oxide layer can be an Aluminum oxide layer or other oxide layer depending on what metal material used in in-fab RDL 102.

The aluminum oxide layer 300 can cause contact resistance between the connection of the post-fab RDL 104 to the in-fab RDL 102. A resultant resistance can depend upon a thickness of the aluminum oxide layer 300. Since a thickness of the aluminum oxide layer 300 may not be controllable the resultant resistance may also not be controllable. If a resistance is higher than a determined threshold, such as about 1.0 Ohm, the resistance may cause functional failure and the integrated circuit package 100 may be unusable. Without a way to test earlier in the fabrication process than at the end of the process, the failure may not be determined until probing after all of the integrated circuit package 100 is completed. In addition, when the integrated circuit package 100 is completed, it may not be known if the failure is caused by the aluminum oxide layer 300 or something else.

Figure 4:
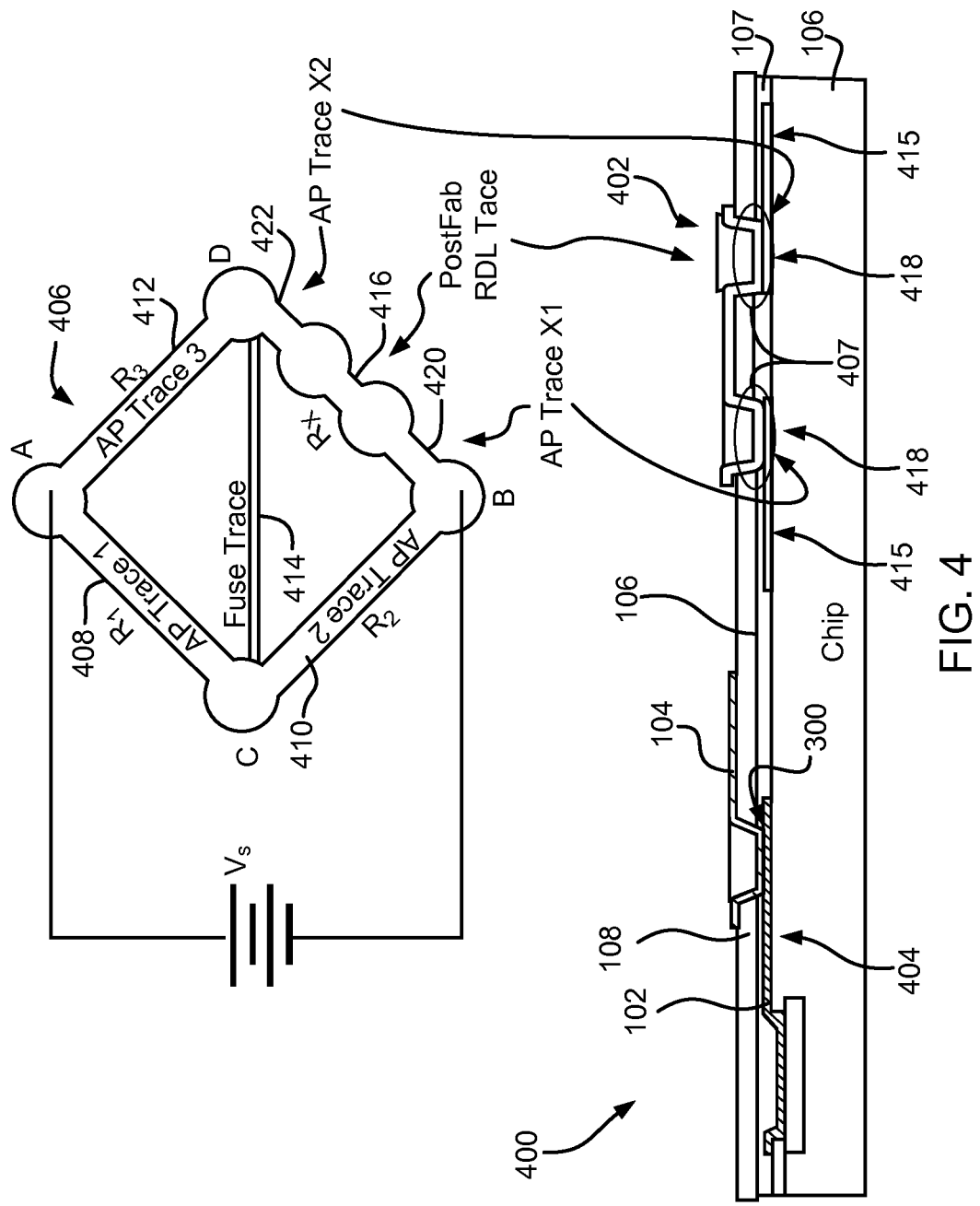
FIG. 4 is a block diagram of an exemplary integrated circuit package structure in cross-section including in-line monitoring of a resistance between in-fab RDL and post-fab RDL.

FIG. 4 is a block diagram of an exemplary integrated circuit package structure 400 in cross-section. The integrated circuit structure 400 can include in-line monitoring of a contact resistance, such as between in-fab RDL 102 and post-fab RDL 104. To implement monitoring, the integrated circuit package 400 can include a monitoring circuit 402 electrically connected with a monitored circuit 404, e.g., the in-fab RDL 102 and the post-fab RDL 104. The monitoring circuit 402 can be positioned on a wafer, die and/or reticle. The monitoring circuit 402 can operable to monitor resistance, e.g., caused by aluminum oxide layer 300. The monitoring can be performed during fabrication of the of the circuit package structure 400, e.g., before completion of the circuit package structure, such as described in FIG. 5.

The monitoring circuit 402 can include circuit traces 406 for monitoring a resistance 407 between a monitored post-fab RDL trace 416 and in-fab aluminum pad (AP) trace X1 420 and in-fab aluminum pad (AP) trace X2 422. Since the aluminum oxide layer 300 can be consistently present on the wafer, die and/or reticle, the monitored resistance 407 can be about the same or similar to the resistance 116 of the connection between the in-fab RDL 104 connector and a post-fab RDL connector 104. The circuit traces 406 can be constructed to include a first trace 408 having a resistance R1, a second trace 410 having a resistance R2, a third trace 412 having a resistance R3 and a fuse trace 414. The first trace 408 can connect the second trace 410 to the third trace 412. The terms first, second and third are used for explanation purposes only, and may not indicate order.

The circuit traces 406 can also include a post-fab RDL trace 416. The post-fab RDL trace 416 can connect with AP trace X1 420 and AP trace X2 422 which can be constructed in-fab in the AP layer. The post-fab RDL trace 416 can include a contact resistance with the AP trace X1 420 and the AP trace X2 422. The contact resistance can be caused by the aluminum oxide layer 300 that can form on the aluminum of the in-fab RDL connector 102, the AP trace X1 420 and the AP trace X2 422 in the time between in-fab and post-fab processing. The second trace 410 can connect with the AP trace X1 420 and the third trace 412 can connect with the AP trace X2 422. The first trace 408, the second trace 410, the third trace 412 and the fuse trace 414 can be positioned in an area 415 that does not connect with the post-fab RDL 416 and is not affected by any contact resistance.

Together the first trace 408, the second trace 410, the third trace 412, the fuse trace 414, the post-fab RDL trace 416, the AP trace X1 420 and the AP trace X2 422 can be arranged to form resistance monitoring circuit, such as a wheatstone bridge circuit. The wheatstone bridge circuit, or other circuit, is used to measure an unknown electrical resistance by balancing two legs of bridge circuit, one leg of which includes the component having the unknown resistance. For example, resistances R1, R2 and R3 can be constructed to include determined similar resistances. Exemplary resistances R1, R2 and R3 can include about 100 mΩ. To provide about 100 mΩ the traces 408, 410, 412 can include a width of about 20 um and a length of about 200 um. An exemplary resistance of the fuse trace 414 is about 1Ω. To provide about 1Ω the fuse trace 414 can include a trace width of about 3-5um and a trace length of about 100um or more.

Monitoring voltage VS can be applied to points A and B of the circuit traces 406 and voltage VG can be observed across the fuse trace 414, where: VG is $$(RX/(R3+Rx)-R2/(R1+R2)).$$

If the contact resistance RX, the resistance between the post-fab RDL trace 416 and the AP trace X1 420 and AP trace X2 422, is low (~mΩ) then the value R2 approximately equals RX. If R2 approximately equals RX then VG is about zero and about no current, or very low current, flows through the fuse trace 414. Thus, the fuse trace 414 remains intact.

If the contact resistance is high (>>mΩ) a high current flows at fuse trace 414 and the fuse trace 414 can fuse or break. When the fuse trace 414 is fused it can indicate a high contact resistance between the post-fab RDL 416 and the AP trace X2 420 and AP trace X2 422. In other examples, instead of or in addition to using the fuse trace 414, voltage and/or current can be measured from point C to point D of the circuit traces 406 to determine if a low or high current is flowing. Since the monitoring circuit 402 and the monitored circuit 404 include a same or similar aluminum oxide layer between in-fab and post-fab components, a detected high resistance current in the monitoring circuit 402 can indicate a high resistance for the post-fab RDL104 in the monitored circuit 404.

Figure 5:
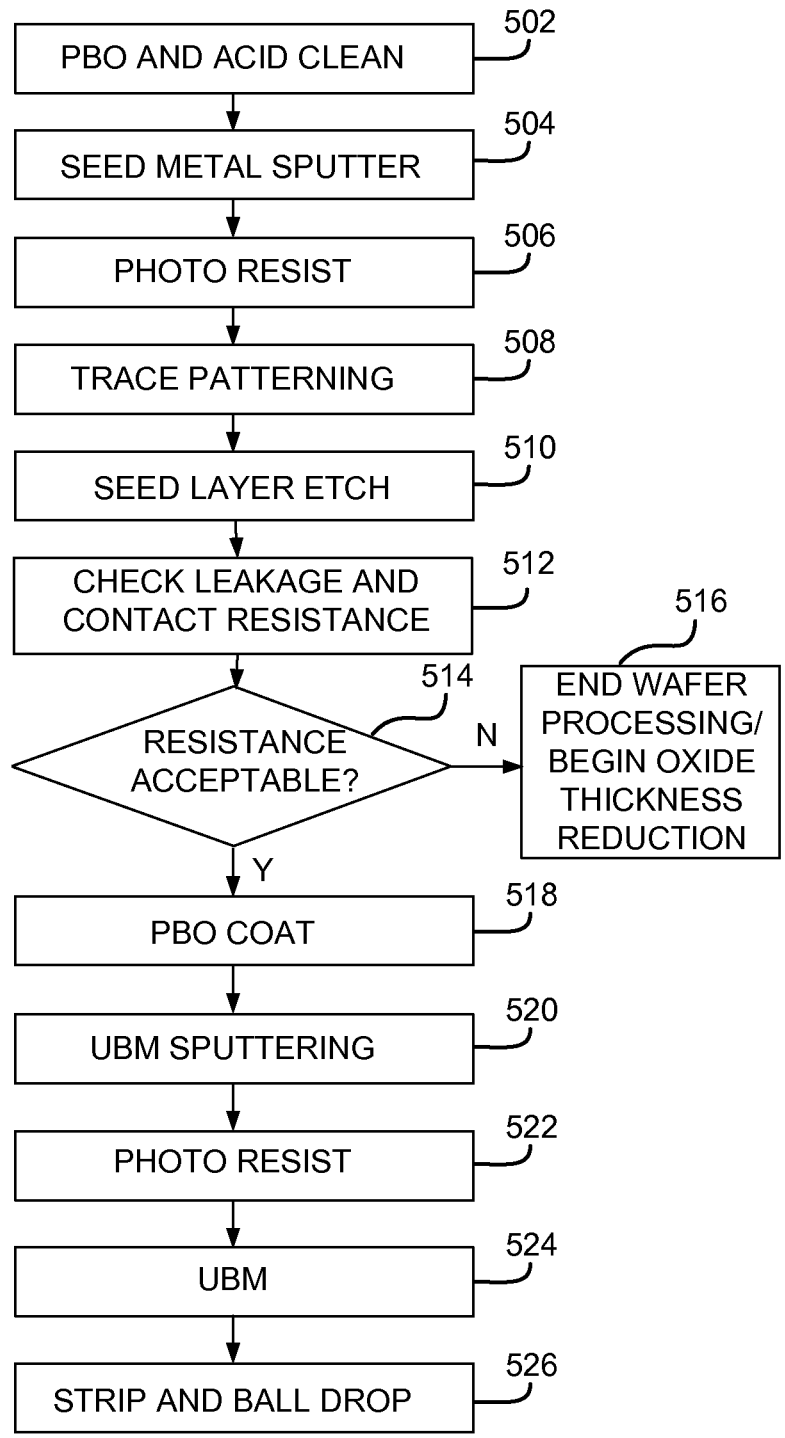
FIG. 5 is a flow diagram of an exemplary process for post-fab fabricating of a wafer for an integrated circuit.

FIG. 5 is a flow diagram of an exemplary process for post-fab fabricating of a wafer for fabricating an integrated circuit. For purposes of explanation the integrated circuit includes a wafer level ball grid array integrated circuit. At block 502, a passivation layer, such as of PBO, can be coated, developed, cured, descum processed and acid cleaned. At block 504, seed metal sputtering can be applied. At block 506, a photoresist coat can be applied to the metal sputtering to define post-fab RDL areas. The photoresist can be exposed, developed and hard baked. At block 508, trace patterning can be performed, such as by electroplating Copper or another metal to form the post-fab RDL's. At block 510, a seed layer can be etched.

At block 512, leakage and contact resistance between in-fab and post-fab components can be checked, such as with the in-line monitoring of FIG. 4. At block 514, it can be determined if the resistance is an acceptable amount or not, such as if the resistance is below a determined threshold. If the resistance level is not acceptable, e.g., higher than a determined threshold of about 1.0 Ohm, the wafer processing can end at block 516. In addition, wafers from similar in-fab processing batches can be treated, such as by applying extra acid cleaning, before post-fab processing to remove or reduce a thickness of the oxide layer to lower the resistance between in-fab and post-fab components.

Thus, resistance issues can be detected directly after RDL plating and prior to a final wafer probe. This may save several weeks cycle time if there is issue and save many failure analysis jobs since the issue is narrowed to the resistance. Alternatively or additionally, wafers from the same or similar batch can be saved that could otherwise have been processed and discarded for including too high a resistance. There can be no extra cost and process steps since already existing in-fab RDL and post-fab RDL traces can be leveraged.

At block 518, a PBO coat can be applied, exposed, developed, cured, put through a descum process and cleaned. At block 520 UBM sputtering can be applied. At block 522, a photoresist can be coated, exposed, developed and baked to mask for UBM plating. At block 524, a UBM, such as of nickel/copper, may be applied with electroplating. At block 526, the photoresist can be stripped and the fabrication can continue with an etch, flux, solder ball drop and reflow.

While various embodiments of the invention have been described, it will be apparent to those of ordinary skill in the art that many more embodiments and implementations are possible within the scope of the invention.

What is claimed is:

1. An integrated circuit, comprising:
   a monitoring circuit; and
   a monitored circuit connected with the monitoring circuit, the monitored circuit comprising an in-fab redistribution layer connector and a post-fab redistribution layer connector; and the monitoring circuit configured to determine at a stage before fabrication of an additional layer of the integrated circuit, if a resistance of a connection between the in-fab redistribution layer connector and the post-fab redistribution layer connector exceeds a threshold, the resistance being indicative of a thickness of an oxide layer formed between the in-fab redistribution layer connector and the post-fab redistribution layer connector.

2. The integrated circuit of claim 1 where the monitoring circuit comprises a wheatstone bridge circuit to determine the resistance when a voltage is applied.

3. The integrated circuit of claim 1 where the monitoring circuit includes a fuse trace to break when resistance of the connection exceeds the threshold.

4. The integrated circuit of claim 3 where the fuse is positioned in an aluminum pad layer.

5. The integrated circuit of claim 1 where the monitoring circuit includes an in-fab trace positioned in an aluminum pad layer.

6. The integrated circuit of claim 5 where the monitoring circuit includes a post-fab trace connected with the in-fab trace.

7. The integrated circuit of claim 1 where the monitored circuit comprises a wafer level ball grid array package structure.

8. The integrated circuit of claim 1 where, the in-fab redistribution layer connector is included in a first layer of a package structure of the integrated circuit, and the post-fab redistribution layer connector is included in a second layer of the package structure, the second layer formed on the first layer ahead of the stage and before the additional layer is formed in the package structure.

9. An integrated circuit, comprising:
an in-fab redistribution layer connector;
a post-fab redistribution layer connector connected with the in-fab redistribution layer connector to make an electrical connection;
an oxide layer located between the in-fab redistribution layer connector and the post-fab redistribution layer connector, the oxide layer providing a connector resistance to the electrical connection; and
a monitoring circuit connected with the oxide layer, the monitoring circuit to determine if a resistance between the in-fab redistribution layer connector and the post-fab redistribution layer connector caused by the oxide layer exceed a threshold.

10. The integrated circuit of claim 9 where the monitoring circuit includes an in-fab trace positioned in an aluminum pad layer.

11. The integrated circuit of claim 10 where the monitoring circuit includes a post-fab trace connected with the in-fab trace.

12. The integrated circuit of claim 9 where the monitoring circuit includes a fuse trace to break when the connector resistance exceeds the threshold.

13. The integrated circuit of claim 12 where the fuse is positioned in an aluminum pad layer.

14. The integrated circuit of claim 9 where the oxide layer comprises an aluminum oxide layer.

15. The integrated circuit of claim 9 where the monitoring circuit comprises a wheatstone bridge circuit.

16. A monitoring circuit for an integrated circuit, comprising:
an in-fab trace;
a post-fab trace connected with the in-fab trace;
an oxide layer positioned between the in-fab trace and the post-fab trace; and
a fuse trace connected with the in-fab trace, where the fuse trace is operable to break if a resistance caused by the oxide layer exceeds a threshold, and where the in-fab trace, the post-fab trace and the fuse trace comprise a wheatstone bridge circuit.

17. The monitoring circuit of claim 16 where the in-fab trace is located in an aluminum pad layer of the integrated circuit.

18. The monitoring circuit of claim 16 where the post-fab trace comprises a redistribution layer connector.

* * * * *

UNITED STATES PATENT AND TRADEMARK OFFICE
CERTIFICATE OF CORRECTION

PATENT NO. : 8,957,694 B2  
APPLICATION NO. : 13/477313  
DATED : February 17, 2015  
INVENTOR(S) : Kunzhong Hu, Chonghua Zhong and Edward Law Page 1 of 1

It is certified that error appears in the above-identified patent and that said Letters Patent is hereby corrected as shown below:

On the Title Page

At item (75) Inventors:

After Inventor Edward Law, please delete "Ladera Rance, CA (US)" and insert
--Ladera Ranch, CA (US)--

Signed and Sealed this
Twenty-third Day of June, 2015

Michelle K. Lee
*Director of the United States Patent and Trademark Office*